US010778558B2

(12) United States Patent
Palermo et al.

(10) Patent No.: US 10,778,558 B2
(45) Date of Patent: Sep. 15, 2020

(54) METHODS AND APPARATUS TO IMPROVE COMPUTING RESOURCE UTILIZATION

(71) Applicant: Intel Corporation, Santa Clara, CA (US)

(72) Inventors: Stephen Thomas Palermo, Paradise Valley, AZ (US); Dwarkadisha D. Kamhout, Jones Farm, OR (US); Pradeepsunder Ganesh, Chandler, AZ (US); Prabhat K. Gupta, Randolph, NJ (US)

(73) Assignee: Intel Corporation, Santa Clara, CA (US)

( * ) Notice: Subject to any disclaimer, the term of this patent is extended or adjusted under 35 U.S.C. 154(b) by 805 days.

(21) Appl. No.: 15/087,287

(22) Filed: Mar. 31, 2016

(65) Prior Publication Data

US 2017/0264680 A1    Sep. 14, 2017

Related U.S. Application Data

(60) Provisional application No. 62/306,048, filed on Mar. 9, 2016.

(51) Int. Cl.
| | |
|---|---|
| *H04L 12/26* | (2006.01) |
| *H04L 29/06* | (2006.01) |
| *G06F 30/34* | (2020.01) |
| *G06F 30/331* | (2020.01) |
| *H04L 12/24* | (2006.01) |
| *H04L 29/08* | (2006.01) |

(52) U.S. Cl.
CPC ............ *H04L 43/16* (2013.01); *G06F 30/331* (2020.01); *G06F 30/34* (2020.01); *H04L 43/0817* (2013.01); *H04L 67/10* (2013.01); *H04L 67/34* (2013.01); *H04L 41/0806* (2013.01)

(58) Field of Classification Search
CPC .................................................. H04L 67/1031
See application file for complete search history.

(56) References Cited

U.S. PATENT DOCUMENTS

| | | | |
|---|---|---|---|
| 2009/0187733 A1 | 7/2009 | El-Ghazawi | |
| 2011/0231644 A1* | 9/2011 | Ishebabi | G06F 8/447 |
| | | | 713/100 |

(Continued)

OTHER PUBLICATIONS

International Searching Authority, "Search Report", issued in connection with U.S. Patent application No. PCT/US2017/014382, dated Jun. 2, 2017, 6 pages.

(Continued)

*Primary Examiner* — Nicholas P Celani
(74) *Attorney, Agent, or Firm* — Hanley, Flight & Zimmerman, LLC

(57) ABSTRACT

Methods, apparatus, systems and articles of manufacture are disclosed to improve computing resource utilization. An example apparatus includes an application specific sensor (AS) to monitor a workload of a platform, the workload executing on at least one general purpose central processing unit (CPU) of the platform, and a dynamic deployment module (DDM) to: in response to a workload performance threshold being satisfied, identify a bit stream capable of configuring a field programmable gate array (FPGA) to execute the workload, and configure the FPGA via the bit stream to execute at least a portion of the workload.

24 Claims, 9 Drawing Sheets

(56) References Cited

U.S. PATENT DOCUMENTS

| | | | | |
|---|---|---|---|---|
| 2012/0297238 A1* | 11/2012 | Watson | ............... | G06F 9/5088 714/4.11 |
| 2013/0191888 A1* | 7/2013 | Chhabra | ............... | G06F 21/31 726/5 |
| 2015/0046513 A1* | 2/2015 | Elias | ............... | H04L 67/16 709/203 |
| 2015/0295790 A1 | 10/2015 | Cropper et al. | | |

OTHER PUBLICATIONS

International Searching Authority, "Written Opinion", issued in connection with U.S. Patent application No. PCT/US2017/014382, dated Jun. 2, 2017, 9 pages.

Chen et al., "Enabling FPGAs in the Cloud", In Proceedings of the 11th ACM Conference on Computing Frontiers, May 20-22 2014, 10 pages.

Stuart Byma et al., "FPGAs in the Cloud: Booting Virtualized Hardware Accelerators with OpenStack", In IEEE 22nd Annual International Symposium on Field-Programmable Custom Computing Machines, May 11-13 2014, 8 pages.

Moor Insight & Strategy, "Moving Beyond CPUs in the Cloud: Will FPGAs Sink or Swim?", Dec. 2, 2014, 5 pages.

PK Gupta, "Intel Xeon+FPGA platform for the data center", In: Field-programm able Logic and Applications (FPL) 15 Workshop on Reconfigurable Computing for the Masses, Sep. 4, 2015, 24 pages.

Hemsoth, "Intel Marrying FPGA, Beefy Broadwell for Open Compute Future," The Next Platform, Mar. 14, 2016, retrieved from <http://www.nextplatform.com/2016/03/14/intel-marrying-fpga-beefy-broadwell-open-compute-future/>, retrieved on Apr. 6, 2016, 4 pages.

Anonymous, "Amazon Web Services," Wikipedia, last modified Feb. 26, 2016, retrieved from <https://en.wikipedia.org/w/index.php?title=Amazon_Web_Services&oldid=706986120>, retrieved on Feb. 28, 2016, 8 pages.

Anonymous, "Field-Programmable Gate Array," Wikipedia, last modified on Feb. 13, 2016, retrieved from <https://en.wikipedia.org/w/index.php?title=Field-programmable_gate_array&oldid=704784687>, retrieved on Feb. 29, 2016, 13 pages.

Anonymous, "FPGA or CPU?," fpgacenter.com, 2010-2013, retrieved from <http://fpgacenter.com/fpga/fpga_or_cpu.php>, retrieved on Feb. 29, 2016, 1 page.

European Patent Office, "Extended European Search Report," issued in connection with European Patent Application No. 17763685.9, dated Jul. 10, 2019, 10 pages.

Pellizzoni et al., "Hybrid Hardware-Software Architecture for Reconfigurable Real-Time Systems," IEEE Real-Time and Embedded Technology and Applications Symposium, Apr. 22, 2008, 12 pages.

Kekely et al., "Software Defined Monitoring of Application Protocols," IEEE Transactions on Computers, Feb. 1, 2016, 9 pages.

Happe et al., "On-the-Fly Computing: A Novel Paradigm for Individualized IT Services," IEEE International Symposium on Object/Component/Service-Oriented Real-Time Distributed Computing, Jun. 19, 2013, 9 pages.

European Patent Office, "Communication under Rule 71(3) EPC," issued in connection with European Patent Application No. 17763685.9, dated May 6, 2020, 50 pages.

* cited by examiner

END USER APPLICATION PARAMETERS LIST 300

| DEVELOPER NAME (302) | TARGET FPGA PLATFORM (304) | TARGET APPLICATION TYPE (306) |
|---|---|---|
| ACME FPGA CONSULTANTS | Xilinx UltraScale+ | Packet Inspection |
| ACME FPGA CONSULTANTS | Altera Stratix 10 (344 User I/O) | Packet Inspection |
| ACME FPGA CONSULTANTS | Lattice iCE 40 | Packet Inspection |
| WinRose DEVELOPERS | Altera Arria 10 | Security Processing |
| WinRose DEVELOPERS | Altera Arria 10 | Low Latency Packet Processing |
| WinRose DEVELOPERS | Altera Arria 10 | Packet Inspection |

308: ACME FPGA CONSULTANTS rows
314: WinRose DEVELOPERS rows
310: Packet Inspection grouping
312: Target FPGA Platform cluster (upper)
316: Target FPGA Platform cluster (lower)

FIG. 3

METHODS AND APPARATUS TO IMPROVE COMPUTING RESOURCE UTILIZATION

RELATED APPLICATIONS

This patent claims the benefit of, and priority to, U.S. Provisional Application Ser. No. 62/306,048, entitled "Methods and Apparatus to Improve Cloud Computing Resource Utilization" and filed on Mar. 9, 2016, which is hereby incorporated herein by reference in its entirety.

FIELD OF THE DISCLOSURE

This disclosure relates generally to cloud computing, and, more particularly, to methods and apparatus to improve computing resource utilization.

BACKGROUND

In recent years, cloud service providers (CSPs) have enabled entities (e.g., business developers, merchants, analysts, etc.) to develop and implement (e.g., launch) one or more computing applications without the need to invest capital in computing equipment. Example CSPs maintain computing equipment, such as server farms, that is accessible to one or more users for a fee. In some examples, the computing resources of the CSP equipment (e.g., or portions of the CSP equipment) is accessible to the one or more users and/or clients of the one or more users via one or more networked connections. The networked computing equipment is sometimes referred-to herein as the cloud. Fees charged by the CSP are sometimes based on usage (e.g., a number of processing cycles consumed by a user, memory storage usage, etc.) so that the entities can scale-up or scale-down as needed without spending substantial amounts of capital owning, maintaining and/or managing their own computing equipment.

BRIEF DESCRIPTION OF THE DRAWINGS

FIG. 3 is an example application parameters list generated by the cloud computing environment of FIGS. 1 and 2.

DETAILED DESCRIPTION

Figure 1:
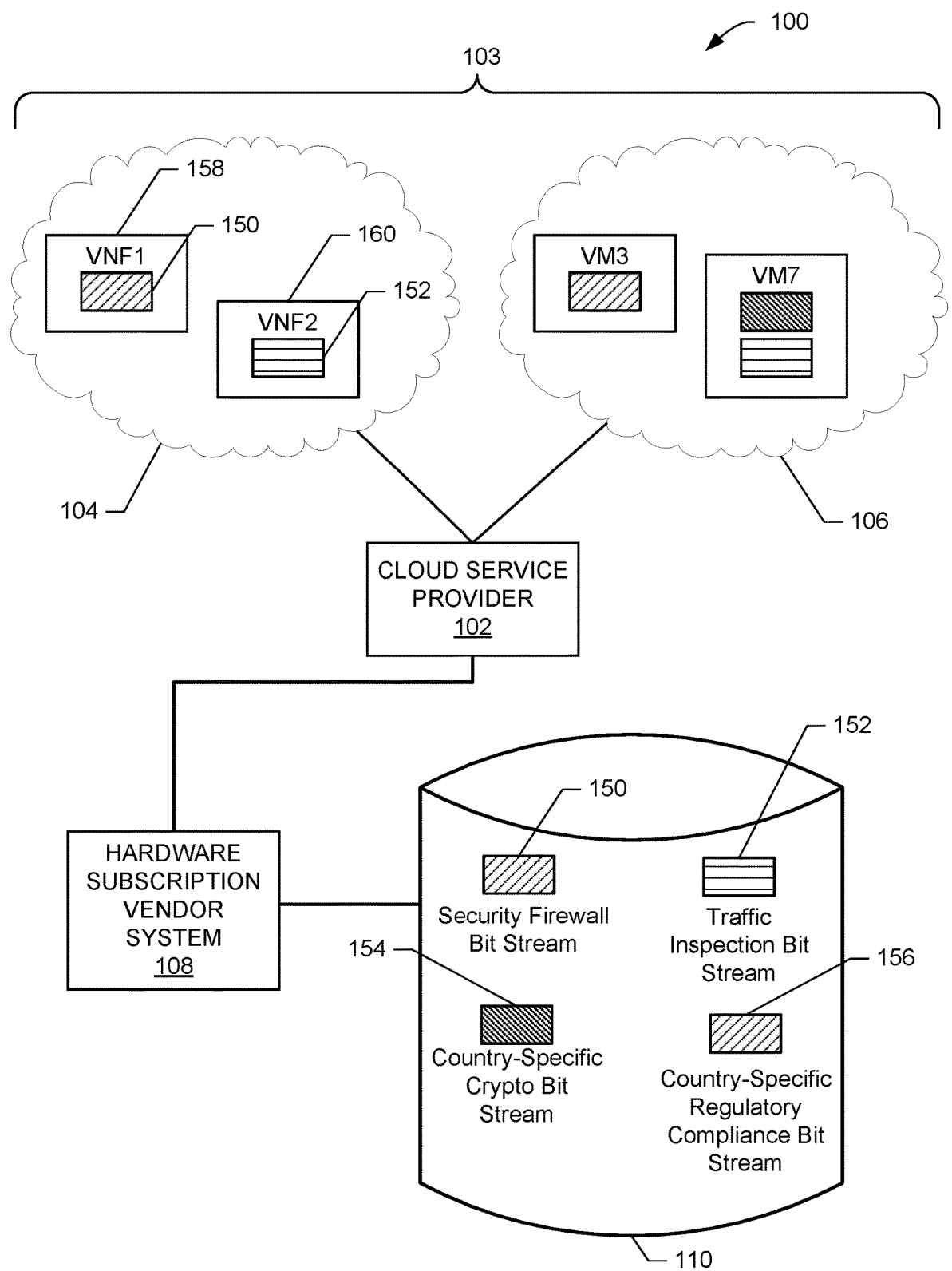
FIG. 1 is a schematic illustration of a cloud computing environment structured in accordance with the teachings of this disclosure to improve computing resource utilization.

Cloud service providers (CSPs) facilitate cloud computing by making computing equipment (e.g., in the cloud) available to users via one or more networked connections. In response to a user request to utilize and/or access computing resources (e.g., a merchant web site transaction processing application, cryptographic processing application(s), etc.), a proportionate amount of the CSPs computing resources (e.g., a portion of the CSPs hardware platform) is allocated to that user's application(s). As such, when user demand for the resource(s) increases, a corresponding consumption of computing resources (e.g., processor cycles and/or storage) also increases. The amount of resource usage (e.g., processor cycles, storage space, etc.) is sometimes a basis for how the CSP charges its clients (also referred to as users). In some examples, a first portion of computing resources is allocated to the user for a particular fee and, if that first portion of computing resources is fully consumed and/or otherwise causes a backlog, then a second (or more) portion of computing resources may be automatically allocated to that user to help maintain performance expectations of the user's application. Of course, the CSP may additionally or alternatively structure their fees according to how many portions of computing resources are available to the user (e.g., a number of processor cores, an amount of storage space, and/or a number of computing cycles consumed by the user's application(s)).

The relationship between the CSP and its clients includes a degree of uncertainty for both parties. Because the client may not initially know how much computing hardware might be needed, computing resources and/or services available via the CSP allows that client to reduce that financial risk and defer/prevent purchase of such computing resources. Similarly, the CSP does not necessarily know ahead of time the degree to which client and/or end-user applications and/or workloads will exhibit demands on their hardware platform (or portions thereof). Clients sometimes demand a certain amount (often guaranteed) of availability from a selected CSP so that performance expectations are met. Metrics associated with service level agreements (SLAs) include, but are not limited to, response time after application demands are initiated, available bandwidth, service availability (e.g., x % availability), time to repair, support response time, unit processing response time (e.g., 500 mSec. for a certain processing task), etc.

While CSPs typically allocate some or all of the time of general purpose computers/processors, general purpose servers and/or general purpose processing cores to respective ones of its clients, some tasks, applications and/or services demanded by the clients include specific and/or otherwise unique requirements. Despite clock speed improvements of general purpose central processing units (CPUs) over the years, the CPU still has a limited structure of inputs, outputs, instruction set, architecture and/or instruction fetch and data protocols. In other words, a general purpose CPU while flexible in programmability, exhibits a fixed hardware structure. On the other hand, field-programmable gate arrays (FPGAs) are integrated circuits that may be customized by a client (and/or an end-user of the client) in the field to perform a particular purpose/task. FPGAs may include any number of logic gates (e.g., AND gates, XOR gates, etc.), memory elements, inputs, outputs, comparators, analog to digital converters, digital to analog converters and/or bidirectional data buses. Additionally, the FPGA is programmatically re-configured at the hardware level (as opposed to a CPU that is programmable by software, but its underlying physical circuitry does not change). As such, FPGAs may be restructured in the field (i.e., by an end user after leaving a manufacturing facility) to exhibit hardware circuits specifically designed to perform specific tasks. In some examples, an FPGA may be configured to accommodate inputs that are relatively wider than what can be processed by a single clock cycle of a general purpose CPU (e.g., data flow is limited by the CPU bus width (e.g., 16-bit, 32-bit, 64-bit, etc.), thereby affording throughput advantages on a per-cycle basis that general purpose CPUs cannot achieve.

Example methods, apparatus, systems and/or articles of manufacture disclosed herein utilize reprogrammable hardware (e.g., FPGAs) in a cloud-based computing environment to increase the efficiency of a cloud computing environment. FPGAs are circuits (e.g., silicon based) that can be programmed in the field to function as a special purpose processor. While FPGAs may be similar to ASICs (Application Specific Integrated Circuits), they differ in important ways. For instance, FPGAs may be programmed after leaving the manufacturing facility (e.g., in the field by an end user) one or more times. In contrast, ASICs are specifically designed to include specific hardware circuitry to perform one or more functions and lack an ability for reconfiguration in the field. FPGAs are, by definition, more flexible and can be designed in the field to perform tasks of interest. Unlike general purpose CPUs (which may be programmed in the field by software or firmware), programming and/or otherwise configuring an FPGA involves creating physical hardware circuits in the FPGA. Hardware circuits are often faster than software routines designed to perform the same function as the corresponding circuitry. Thus, the FPGA can be field programmed to do specific functions with hardware circuits more efficiently than a CPU can perform the same function via software.

Examples disclosed herein facilitate programming of the FPGA hardware (e.g., configuring the FPGA to include a particular circuit layout) during execution of end-user applications in a dynamic manner. For example, third-party subscriptions are disclosed here to facilitate configuring FPGAs to facilitate the hardware-based acceleration during runtime. By dynamically distributing reprogrammable hardware such as FPGAs (e.g., to enable hardware-based acceleration capabilities), performance of cloud-based computing efforts may be improved by realizing software routines with hardware performing the same function, thereby reducing an amount of processor cycles of the CSPs computing resources consumed by the client's application(s). Examples disclosed herein are not limited to CSP computing resource optimization, but may also include localized optimization on a per-machine or per-platform basis. In some examples, an organization information technology (IT) group (e.g., Enterprise IT) is chartered with a responsibility to manage personnel devices (e.g., desktop computers, laptop computers, etc.). In the event these personnel devices include FPGA hardware capabilities (e.g., Intel® Xeon®), examples disclosed herein permit one or more configuration management options for the Enterprise IT group by using one or more physically reprogrammable bit streams. In some examples, the Enterprise IT group may distribute and/or otherwise cause managed devices to retrieve/receive particular physically reprogrammable bit streams to accomplish one or more tasks (e.g., security offload acceleration tasks, searching capabilities, etc.) to be performed by the reprogrammable hardware (e.g., FPGAs) of those devices.

In still other example methods, apparatus, systems and/or articles of manufacture disclosed herein, original equipment manufacturers (OEMs) (e.g., network router manufacturers, security appliance vendors, etc.) may change a persona of the devices based on particular physically reprogrammable bit streams applied thereto. For instance, the OEM may include and/or otherwise be associated with one or more keys (e.g., license keys) that permit access to the physically reprogrammable bit streams that cause the OEM devices to operate in a particular manner depending on which bit stream(s) are implemented at a given time. In some examples, the OEM devices may operate in an effort to search network traffic (e.g., deep packet inspection) for specific content and, in response to application of one or more alternate physically reprogrammable bit streams, operate in an effort to perform an alternate task(s). Some examples include default access to particular physically reprogrammable bit streams without additional fees, while other examples may require that users of the OEM devices must pay for other physically reprogrammable bit streams.

Further, in examples where the client utilizes cloud-based hardware services, by providing the client with the opportunity to substitute hardware for software execution (e.g., by providing an FPGA), the client enjoys a degree of control to reduce fees paid to the CSP for usage of computing resources as the client now substitutes specialized hardware for software, thereby operating at a greater efficiency. Similarly, the CSP benefits by having a relatively lower demand on shared general purpose computing resources available to its clients because some of the tasks the CSP supports are being processed by the reprogrammable hardware instead of software executing on a general purpose processor. Further, power demands of the CSP are reduced when relatively more efficient reprogrammable hardware resources (e.g., FPGAs) are used instead of software executing on a general purpose processor.

In some examples disclosed herein, the CSP allocates computing resources of one or more platforms to a client. In some examples, the allocated hardware includes (a) one or more general purpose processors and (b) one or more physically configurable hardware devices (e.g., one or more FPGAs). The example client may contract with the CSP in any number of ways, such as paying for a number of processor cycles consumed by the general purpose processors to perform end-user tasks and/or applications. Additionally, the example client may contract with the CSP to have one or more physically configurable hardware devices, such as one or more FPGAs, available for customized use. In some examples, the FPGAs are dedicated to the client (i.e., no other client can access that FPGA). In some examples, the client configures the physically configurable hardware via physically programmed bit stream that is developed by the client, developed by the CSP, or developed by a third-party. Any number of parties may develop physically programmed bit streams to program and/or otherwise configure the physically configurable hardware. As such, examples disclosed herein facilitate a market for which clients (either cloud-based services or localized platform targets) can take advantage of such development efforts by other parties (e.g., third parties) when utilizing CSP hardware platform resources and/or FPGA resources on individual devices. As used herein, a "physically programmed bit stream" is defined to be a source of one or more bits which are structured to cause a physically configurable hardware device (such as an FPGA) to change its circuit topology.

FIG. 1 is a schematic illustration of a cloud-computing environment 100 connected in accordance with the teachings of this disclosure to include one or more physically configurable hardware devices to improve resource utilization in cloud-based environments and/or localized devices. In the illustrated example of FIG. 1, the cloud-computing environment 100 includes a cloud service provider (CSP) 102 that facilitates any number of network services 104 and/or application services 106. In the illustrated example, the CSP 102 is communicatively connected to a hardware subscription vendor (HSV) system 108 that includes any number of hardware subscription objects and/or instruction sets corresponding to any number of physically programmable bit streams (e.g., data) capable of configuring one or more FPGAs to exhibit a particular circuit layout. The physically programmed bit streams of the example are stored in a subscription database 110. In the illustrated example of FIG. 1, the subscription database 110 includes four (4) example physically programmed bit streams. When applied to a target FPGA (e.g., an FPGA from cloud-based resources, an FPGA from an individual device), each of the physically programmed bit streams customizes the FPGA to have a specific circuit configuration and operate in a specific manner. Each circuit configuration is different from the other and, thus, operates in a different manner. To achieve these different topologies, the physically programmed bit streams cause the FPGA to open or close different electronic switches to form different circuit paths. While the example CSP 102 of FIG. 1 is described herein as associated with cloud-based services, such examples are not limited thereto. As described above, examples disclosed herein permit platform optimization using FPGA resources that may be located on individual devices (e.g., platforms, desktop computers, laptop computers, etc.). As such, the example CSP 102 of FIG. 1 may be realized on individual devices to enable utilization of physically programmed bit streams.

The example subscription database 110 of FIG. 1 includes a security firewall bit stream 150, a traffic inspection bit stream 152, a country-specific cryptography bit stream 154 (e.g., European specific), and a country-specific regulatory compliance (e.g., financial trading telemetry) bit stream 156. While the illustrated example subscription database 110 includes four (4) example physically programmable bit streams, examples disclosed herein are not in any way limited thereto. The illustrated example of FIG. 1 also shows that a client has already obtained certain physically programmable bit streams and configured FPGA devices in the cloud using those physically programmable bit streams (e.g., the example security firewall bit stream 150 and the example traffic inspection bit stream 152 may represent a subscription object for which the client paid for). For example, the client network services 104 includes a first FPGA 158 that executes first virtual network function ($VNF_1$) 158. That first FPGA 158 was physically configured by executing the security firewall bit stream 150. Further, the client network services 104 also includes a second FPGA 160 that executes a second virtual network function ($VNF_2$) 160. The second FPGA 160 was physically configured by executing the traffic inspection bit stream 152. As such, the client virtual network functions (e.g., $VNF_1$, $VNF_2$, etc.) use FPGA devices to effectively perform functions in hardware rather than performing those functions by executing software in general purpose CPUs. Programmed general purpose CPUs are less efficient and slower than the customized FPGAs at performing the software functions. In other words, the FPGAs have replaced one or more general purpose CPUs as the executor of one or more of the client's virtual network functions. This redistributes the load from the CPUs to hardware and results in faster and/or more efficient operation.

The example CSP 102 of FIG. 1 includes one or more platforms including hardware resources to be used by the clients (e.g., client network services 104, client application services 106). The hardware resources may include processors (e.g., server farms) and FPGAs. As used herein, a "platform" is an arrangement of computing hardware, such as processing hardware (e.g., one or more general purpose CPUs having one or more cores, one or more FPGAs, etc.), memory, software (e.g., an operating system), and I/O (input/output systems and/or devices). Each CSP 102 may include any number of platforms. Each platform may have separate portions, such as processing hardware portions. In some examples, a first portion of processing hardware includes general purpose CPUs, in which each CPU may include any number of processing cores. The CPUs may instantiate one or more virtual machines. In still other examples, a second portion of the processing hardware includes reprogrammable hardware, such as any number of FPGAs. The hardware platform may implement one or more virtual machines to execute one or more tasks.

The example HSV system 108 may be independent from the CSP 102 and operate as a third party service for the clients. In some examples, the HSV system 108 operates as a repository for developers of physically programmable bit streams (e.g., third party developers, CSP-based developers, etc.). These physically programmable bit streams can be purchased by the clients and executed to program FPGAs within the CSP 102 that have been allocated to those clients.

Physically programmed bit streams may be designed in any number of ways such that upon execution they customize an FPGA (e.g., configure the FPGA to form a specific circuit or circuit topology). Example applications that a customized FPGA may implement include security firewall applications, traffic inspection applications, signal processing applications, IP store applications, equipment manufacturer upgrade application, bug fix applications, and/or image processing applications. In some examples, a customer/client of the CSP may develop and/or distribute services to their clients. As described above, the client and/or end-user experience may include a particular suite of services provided by a client to cause the reprogrammable hardware to exhibit a particular persona. Such examples may be realized by one or more virtual machines (VMs) instantiated on the resources of the CSP. However, in the event the persona (e.g., suite of services) for the client (and their corresponding end-user(s)) is to be altered (e.g., different functionality is needed at different times of the day), then a download of alternate physically programmable bit stream(s) allows the VM to establish the alternate persona when such bit streams are used to configure one or more FPGAs. Some designers of physically programmable bit streams may have particular expertise for particular brands and/or types of FPGAs. As such, the example HSV system 108 facilitates a market repository for any type of physically programmable bit stream that may be distributed to an end-user as an executable instruction (e.g., a binary executable capable of configuring an FPGA to perform a specific function via a specific circuit topology).

In operation, the example CSP 102 of the cloud-computing environment 100 identifies one or more client applications that satisfy (e.g., exceed) threshold operating parameters, such as a utilization metric for a processor (and/or VM) on which the client application executes. In response to identifying a particular application that satisfies the threshold operating parameters, the example CSP 102 identifies candidate physically programmable bit streams of the example HSV system 108 that may be appropriate to relieve the inundated CPU and/or VM from the excessive processing demands of the application. If one of the candidate physically programmable bit streams is appropriate, a selected one of the candidate physically programmable bit streams is authorized to be used to configure an FPGA, and the example CSP 102 configures the FPGA with the selected bit stream. In some examples, the CSP 102 invokes a request to the HSV system 108 to forward, send and/or otherwise distribute the corresponding bit stream to the CSP 102 so that one or more FPGAs may be configured. In still other examples, the CSP 102 maintains the corresponding physically programmable bit stream in a memory, particularly in circumstances where the corresponding physically programmable bit stream is used on a regular basis.

Using the corresponding physically programmable bit stream, the example CSP 102 configures the FPGA so that it may execute the client's objectives. In some circumstances, the FPGA execution may accomplish one or more objectives of the client's application in a manner that is faster (e.g., less latency) and/or more efficient than can be achieved by executing software on a general purpose CPU (e.g., provided by the example CSP 102, provided by the general purpose CPU of an individual device). In other words, the hardware based FPGA execution allows the general purpose CPUs to offload operations that they would otherwise be executed via software to hardware specifically configured to perform that function more quickly and/or efficiently. In some examples, the physically programmable bit streams may be used to configure the FPGA prior to provisioning cloud computing resources (e.g., general purpose CPUs), while in other examples the physically programmable bit streams may be used to configure the FPGA(s) during run time of the client application(s) (e.g., in response to information pertaining to actual workload). As such, a number of consumed processor cycles of the general purpose CPU may be reduced (e.g., on the fly in response to changed network demands), thereby resulting in cost savings for the client in the event the client is charged based on CPU usage.

In the event one or more physically programmed bit streams are not utilized for a period of time, such as a threshold period of time and/or a threshold number of instances per unit of time, then the example CSP 102 may vacate (flush) that particular bit stream from memory so that other bit streams may be stored therein.

As described in further detail below, examples disclosed herein enable client network and/or client application services to at least partially execute on FPGA devices provisioned by the example CSP 102. Additionally, such capabilities enable a reprogrammable hardware-based subscription model for CSPs and developers (e.g., independent third party developers) to provide customized physically reprogrammable bit streams that optimize functionality to support the client applications. Example physically reprogrammable bit streams may configure the circuitry of the reprogrammable hardware software-as-a-service (SaaS) and/or infrastructure-as-a-service (IaaS) applications and/or network capabilities. In some examples, the HSV 108 establishes pay-as-you-go agreements with the clients to determine billing requirements, while in other examples the CSP 102 establishes agreements including hosting fees for the privilege of utilizing available reprogrammable hardware and/or transaction fees for such reprogrammable hardware utilization. As such, the example cloud computing environment 100 of FIG. 1 enables CSPs to extend their capabilities to clients to access reprogrammable hardware devices, as well as enabling third party developers of physically reprogrammable bit streams that target reprogrammable hardware devices to support their services to those clients.

Figure 2:
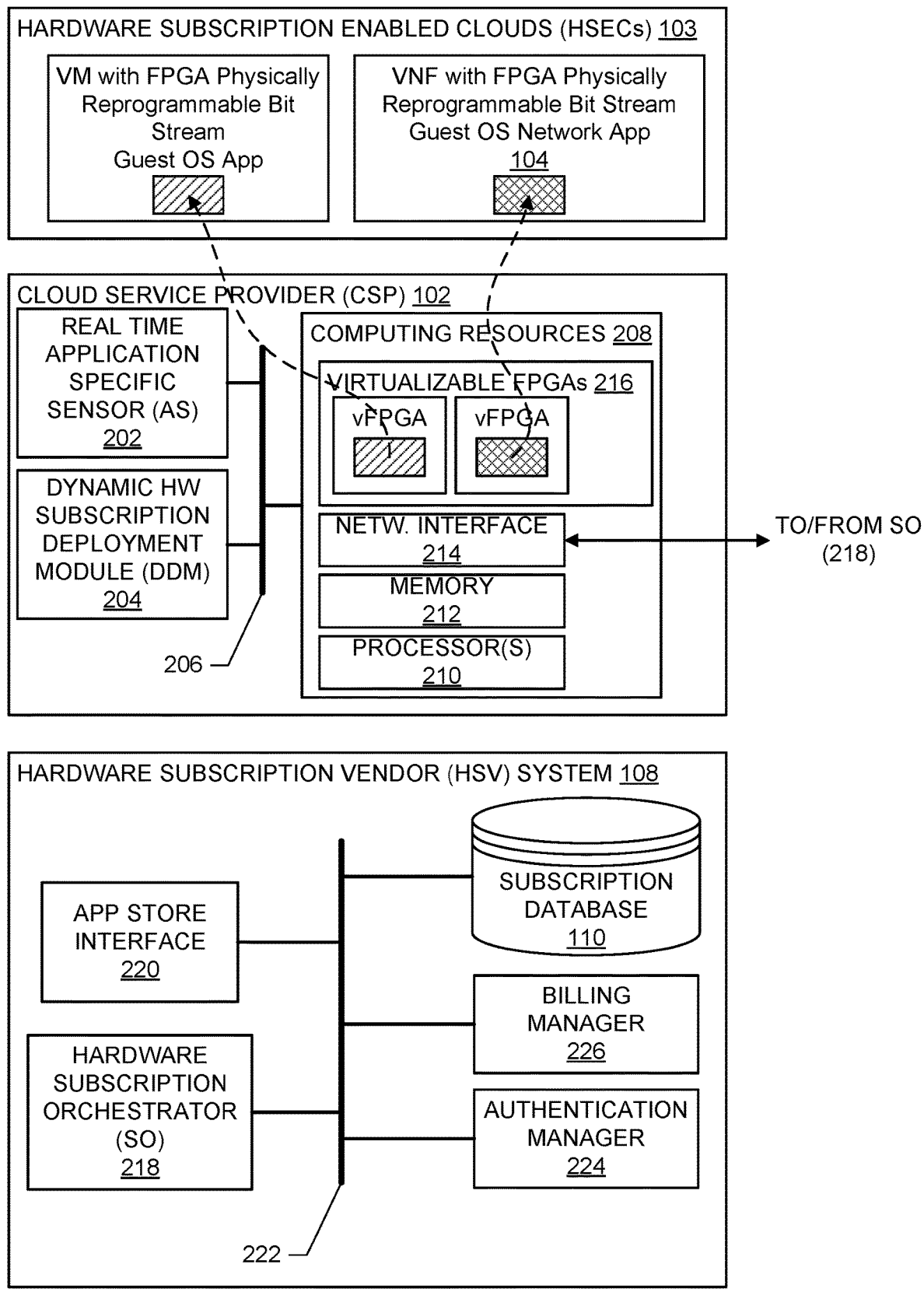
FIG. 2 is a schematic illustration of the cloud computing environment of FIG. 1 illustrating example implementations of an example cloud service provider and an example hardware subscription vendor system.

FIG. 2 is a schematic illustration showing an example implementation of the example cloud-computing environment 100 of FIG. 1. In the illustrated example of FIG. 2, the CSP 102 is communicatively connected to (a) the hardware subscription enabled clouds (HSECs) 103. The HSECs 103 of the illustrated example include the example client network services 104 and the example client application services 106, and (b) the HSV system 108. The example CSP 102 of FIG. 2 includes an application specific sensor (AS) 202, and a dynamic hardware subscription deployment module (DDM) 204 connected to a CSP bus 206. The example CSP 102 also includes computing resources 208, which includes any number of platforms having any number of processors 210 (e.g., general purpose CPUs), memory 212, network interface(s) 214 and reprogrammable hardware devices 216 (e.g., FPGAs). Example computing resources may include servers with general purpose CPUs (e.g., Intel® Xeon®) having virtualization capabilities. The general purpose CPUs are in communication with the FPGAs. In some examples, the general purpose CPUs and reprogrammable hardware are physically co-located on one silicon package, such as the Intel® Xeon®+FPGA multi-chip package. In such examples, the general purpose CPU and the reprogrammable hardware are coupled together using both a UPI2 high-speed interconnect and optional PCIe interconnects to provide low latency data transfers. Such combined packages may also include a programming interface coupled between the general purpose CPU and reprogrammable hardware to accept and/or otherwise download physically reprogrammable bit streams that originate from a memory device and/or third parties via a network interface. As described above, the example computing resources 208 facilitate execution of any number of HSECs 103.

The illustrated example of FIG. 2 also includes an example implementation of the HSV system 108, which includes an example hardware subscription orchestrator (SO) 218, and an example application store interface 220, both of which are communicatively connected to an example HSV bus 222. The example HSV bus 222 is further communicatively connected to the example subscription database 110, an example authentication manager 224, and an example billing manager 226.

In operation, the example AS 202 monitors a client application (e.g., the example client network service 104, the example client application service 106) is executing or is to be executed. During a setup stage of operation, the example AS 202 may continue to monitor for such workloads, such as by employing a performance monitor facilitated by a platform operating system, such as PerfMon in the Windows® family of operating systems. Each workload detected by the example AS 202 may be configured or otherwise associated with a corresponding threshold performance value, such as a percent threshold of general purpose CPU utilization, a percent threshold of memory utilization, a bandwidth threshold value of traffic, etc. As described in further detail below, in the event a threshold value is satisfied (e.g., exceeded), then the example AS 202 may invoke reprogrammable hardware resources to better manage performance of the client application. One or more established threshold values for respective client applications may form a policy, such that satisfaction of one or more thresholds may result in the invocation (e.g., programming one or more FPGAs and load shifting to the newly configured devices) of a corresponding reprogrammable hardware resource. In other examples, a client application activity flag may be established instead of a threshold performance value. In such circumstances, the example AS 202 may invoke reprogrammable hardware resources as soon as the client application has begun execution. In still other examples, reprogrammable hardware resources may be configured at boot time to allow a basic input/output system (BIOS) to load a corresponding physically reprogrammable bit stream to one or more reprogrammable hardware devices to program the devices for the device functionality.

Other examples include dynamically adding new physically reprogrammable bit streams to facilitate hardware acceleration (e.g., programming reprogrammable hardware to perform different functions in hardware instead of software or a general purpose CPU to perform functions. In some examples, virtual machines (VMs) are spawned to offload CPU tasks to the reprogrammable hardware (e.g., FPGAs). For example, some virtual machine managers (VMMs) are capable of virtual device hot-plugging, in which a new physically reprogrammable bit stream may be hot-plugged via a QEMU bus. When an operating system kernel identifies an opportunity for acceleration, a VM can characterize and load corresponding acceleration driver(s) (e.g., bit streams) and notify a corresponding application (e.g., Linux signals, interrupts, etc.). In the event a driver is aware of acceleration options, then the corresponding application may switch to the acceleration physically reprogrammable bit stream. In still other examples, the AS 202 may be an optional component, particularly in circumstances where computing resources are provided by a cloud-based service. For example, the CSP 102 may require an additional fee charged to clients to perform one or more services of the AS 202. The example AS 202 may be initially set in a default state (e.g., initially disabled) and, in response to a toggle request for services provided by the AS 202, the AS 202 may be activated (e.g., after client consent to a fee).

Continuing with the example where the AS 202 has detected a client application that has satisfied one or more policy threshold values and/or activity flags, the example DDM 204 determines whether an existing subscription (e.g., an existing agreement to use one or more physically reprogrammable bit streams for reprogrammable hardware configuration purposes) has been established for the client application. If so, then the example DDM 204 determines whether an available physically reprogrammable bit stream is already stored in the example memory 212. If so, then the example DDM 204 configures the reprogrammable hardware resource(s) using the subscribed physically reprogrammable bit stream and initiates the reprogrammable hardware resource(s) to handle and/or otherwise execute the client application. However, in the event the example DDM 204 determines that an existing subscription has been established with the client application, but it is not stored in the example memory 212, then the example DDM 204 invokes the example HSV system 108 to retrieve the appropriate physically reprogrammable bit stream and then configures the reprogrammable hardware resource(s) using the same.

In circumstances where the client application does not have an existing or previously established subscription to an appropriate physically reprogrammable bit stream that is able to establish reprogrammable hardware to assist execution of the client application, the example DDM 204 manages candidate subscription options by invoking the example HSV system 108, as described in further detail below. In the event an appropriate physically reprogrammable bit stream is selected, paid for or compensated (e.g., no charge when hardware is updated to fix bugs, standard upgrade agreements at no charge, etc.) (e.g., via the example billing manager 226), and authorized (e.g., by the example authentication manager 224), then the retrieved and/or otherwise obtained physically reprogrammable bit stream is initiated by the example DDM 204. Of course, in the event the example HSV system 108 does not include an appropriate physically reprogrammable bit stream that is capable of executing the client application, then the example DDM 204 configures the example computing resources 208 to continue to employ general purpose processing resources (e.g., one or more general purpose CPUs) to execute the example HSEC 103. In the event that any developer later creates one or more physically reprogrammable bit streams that target the client application, such physically reprogrammable bit streams may be added to the example subscription database 110 to be offered as an optimization resource.

While the example AS 202 monitors workloads and/or client applications (e.g., one or more HSECs 103, such as the example client network service 104 and/or the example client application service 106), the example AS 202 also monitors for instances of inactivity of such client applications. In particular, if a physically reprogrammable bit stream stored in the example memory 212 has not been utilized and/or otherwise invoked after a threshold amount of time, then the AS 202 instructs the example DDM 204 to remove it from the memory 212 to conserve storage resources for one or more other physically reprogrammable bit streams that may be more frequently used and/or otherwise needed. In other words, the example AS 202 vacates (flushes) underutilized physically reprogrammable bit streams from the example memory 212 in a dynamic manner.

Returning to the example where an existing physically reprogrammable bit stream is known to be able to program reprogrammable hardware to improve the efficiency of a client application, but is not currently stored in the example memory 212, the example SO 218 retrieves and/or otherwise receives a request from the example DDM 204 for the identified subscribed physically reprogrammable bit stream. In particular, the example SO 218 identifies the appropriate physically reprogrammable bit stream from the example subscription database 110 based on an identifier of a workload (e.g., one or more end-user applications), and the example billing manager 226 verifies that all billing requirements have been satisfied. In some examples, the billing manager 226 verifies existing agreements between the client and the third party developer of the selected physically reprogrammable bit stream, such as billing account information and/or in circumstances where an OEM has an agreement for such bit stream access. Additionally, the example authentication manager 224 verifies that the physically reprogrammable bit stream is authorized to be distributed to the requestor, such as the client application currently executing via resources provided by the CSP 102 and/or resources of an individual device not necessarily associated with cloud-based resource utilization. Authorization may include analyzing the request from the DDM 204 for one or more identifiers, such as unique serial numbers, hash values, license keys, etc. that may have been created for a particular client at the time the corresponding physically reprogrammable bit stream was originally purchased. After such authorization is verified, the example SO 218 distributes and/or otherwise sends the requested physically reprogrammable bit stream to the example DDM 204 to be instantiated on the computing resources 208 of the CSP 102 (or stand-alone device(s)), such as one or more reprogrammable hardware devices allocated to the client (and/or the client's end-user(s)).

Returning to the example in which the client application does not have any pre-existing subscription to an appropriate physically reprogrammable bit stream that is capable of improving the performance of the client application, the example SO 218 retrieves and/or otherwise receives parameters associated with the client application. Example parameters may include any number of details related to the client application such as, but not limited to the target reprogrammable hardware type that is available to the end-user (e.g., based on FPGA types that the CSP 102 is able to allocate to their user base) and/or a target application type (e.g., packet inspection applications, security processing applications, low latency packet processing applications, switching applications, routing applications, cryptography (e.g., region and/or country-specific) applications, video/audio processing applications, etc.).

FIG. 3 is an example application parameters list 300 that is generated and maintained by the example SO 218. Generally speaking, the example application parameters list 300 identifies contents of available physically reprogrammable bit streams stored in the example subscription database 110. In the example of FIG. 3, the list 300 also identifies parameters that are specific to each physically reprogrammable bit stream. In the illustrated example of FIG. 3, the application parameters list 300 includes a developer name column 302, a target FPGA platform column 304, and a target application type column 306. In some examples, some developers may specialize in one type of FPGA application development, such as the developer named "Acme FPGA Consultants" 308, which specializes in applications related to "Packet Inspection" 310". Additionally, while Acme FPGA Consultants 308 specializes in one type of application, that developer has particular physically reprogrammable bit streams that target three different types of FPGA devices 312. On the other hand, the example developer named "Winrose Developers" 314 only specializes in one type of FPGA device 316 (i.e., the Altera Arria 10 series FPGA). However, that developer has a variety of application types for that particular FPGA device.

In operation, the example DDM 204 sends a query to the example SO 218 to determine whether the HSV system 108 contains one or more physically reprogrammable bit streams that might be relevant to a client's application. For example, the DDM 204 may send available details related to the client application to the SO 218. The SO 218 attempts to perform a match of candidate physically reprogrammable bit streams that are relevant to the received parameter information. For the sake of example, if the DDM 204 sends only an application parameter that identifies the type of FPGA device which is of interest, then the example SO 218 will return a portion (e.g., a subset) of the application parameters list 300 that is specific to the queried FPGA device type from the example target FPGA platform column 304. On the other hand, if the DDM 204 sends only an application parameter that identifies a type of desired application, then the example SO 218 will return a portion of the application parameters list 300 that is specific to the queried application type details. In some examples, the application store interface 220 includes a graphical user interface and/or web server to render queries and/or selections related to available bit streams stored in the example subscription database 110.

While an example manner of implementing the cloud-computing environment 100 of FIG. 1 is illustrated in FIGS. 1-3, one or more of the elements, processes and/or devices illustrated in FIGS. 1-3 may be combined, divided, rearranged, omitted, eliminated and/or implemented in any other way. Further, the example CSP 102, the example HSV system 108, the example subscription database 110, the example AS 202, the example DDM 204, the example computing resources 208, the example memory 212, the example network interface 214, the example SO 218, the example application store interface 220, the example authentication manager 224, the example billing manager 226 and/or, more generally, the example cloud-computing environment 100 of FIGS. 1-3 may be implemented by hardware, software, firmware and/or any combination of hardware, software and/or firmware. Thus, for example, any of the example CSP 102, the example HSV system 108, the example subscription database 110, the example AS 202, the example DDM 204, the example computing resources 208, the example processors 210, the example memory 212, the example network interface 214, the example SO 218, the example application store interface 220, the example authentication manager 224, the example billing manager 226 and/or, more generally, the example cloud-computing environment 100 of FIGS. 1-3 could be implemented by one or more analog or digital circuit(s), logic circuits, programmable processor(s), application specific integrated circuit(s) (ASIC(s)), programmable logic device(s) (PLD(s)) and/or field programmable logic device(s) (FPLD(s)). When reading any of the apparatus or system claims of this patent to cover a purely software and/or firmware implementation, at least one of the example CSP 102, the example HSV system 108, the example subscription database 110, the example AS 202, the example DDM 204, the example computing resources 208, the example processors 210, the example memory 212, the example network interface 214, the example SO 218, the example application store interface 220, the example authentication manager 224, the example billing manager 226 and/or, more generally, the example cloud-computing environment 100 of FIGS. 1-3 is/are hereby expressly defined to include a tangible computer readable storage device or storage disk such as a memory, a digital versatile disk (DVD), a compact disk (CD), a Blu-ray disk, etc. storing the software and/or firmware. Further still, the example cloud-computing environment 100 of FIGS. 1-3 may include one or more elements, processes and/or devices in addition to, or instead of, those illustrated in FIGS. 1-3, and/or may include more than one of any or all of the illustrated elements, processes and devices.

Flowcharts representative of example machine readable instructions for implementing the cloud-computing environment 100 of FIGS. 1-3 are shown in FIGS. 4-7. In these examples, the machine readable instructions comprise program(s) for execution by a processor such as the processor 812 shown in the example processor platform 800 discussed below in connection with FIG. 8. The program(s) may be embodied in software stored on a tangible computer readable storage medium such as a CD-ROM, a floppy disk, a hard drive, a digital versatile disk (DVD), a Blu-ray disk, or a memory associated with the processor 812, but the entire program(s) and/or parts thereof could alternatively be executed by a device other than the processor 812 and/or embodied in firmware or dedicated hardware. Further, although the example program(s) is/are described with reference to the flowcharts illustrated in FIGS. 4-7, many other methods of implementing the example cloud-computing environment 100 may alternatively be used. For example, the order of execution of the blocks may be changed, and/or some of the blocks described may be changed, eliminated, or combined.

As mentioned above, the example processes of FIGS. 4-7 may be implemented using coded instructions (e.g., computer and/or machine readable instructions) stored on a tangible computer readable storage medium such as a hard disk drive, a flash memory, a read-only memory (ROM), a compact disk (CD), a digital versatile disk (DVD), a cache, a random-access memory (RAM) and/or any other storage device or storage disk in which information is stored for any duration (e.g., for extended time periods, permanently, for brief instances, for temporarily buffering, and/or for caching of the information). As used herein, the term tangible computer readable storage medium is expressly defined to include any type of computer readable storage device and/or storage disk and to exclude propagating signals and to exclude transmission media. As used herein, "tangible computer readable storage medium" and "tangible machine readable storage medium" are used interchangeably. Additionally or alternatively, the example processes of FIGS. 4-7 may be implemented using coded instructions (e.g., computer and/or machine readable instructions) stored on a non-transitory computer and/or machine readable medium such as a hard disk drive, a flash memory, a read-only memory, a compact disk, a digital versatile disk, a cache, a random-access memory and/or any other storage device or storage disk in which information is stored for any duration (e.g., for extended time periods, permanently, for brief instances, for temporarily buffering, and/or for caching of the information). As used herein, the term non-transitory computer readable medium is expressly defined to include any type of computer readable storage device and/or storage disk and to exclude propagating signals and to exclude transmission media. As used herein, when the phrase "at least" is used as the transition term in a preamble of a claim, it is open-ended in the same manner as the term "comprising" is open ended.

Figure 4:
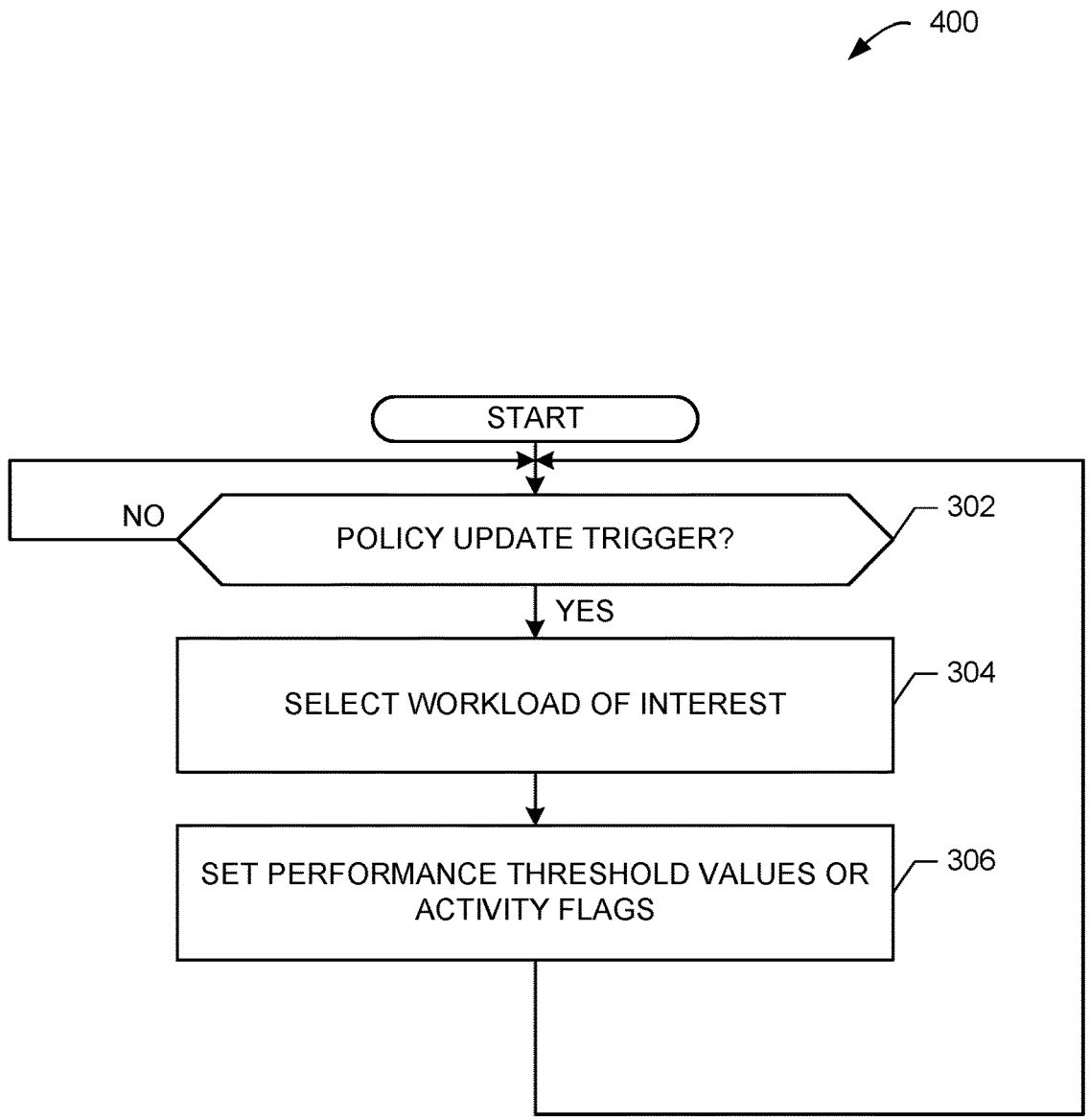
FIGS. 4-7 are flowcharts representative of example machine readable instructions that may be executed to implement the example cloud computing environment of FIGS. 1-3.

The program 400 of FIG. 4 begins at block 402 where the example AS 202 determines if a workload (e.g., a client network service 104, a client application service 106, etc.) has been detected as operating on the example computing resources 208 and/or queued to execute on the computing resources 208. If not, the example AS 202 continues to monitor for workload activity (block 402). For circumstances where AS 202 services are activated (e.g., toggled on in response to a client request (e.g., for a fee)), in response to detecting a workload (block 402), the example AS 202 selects one workload of interest (block 404) and sets one or more performance threshold values or activity flags (block 406). For example, the CSP 102 may include a user interface to allow performance monitoring settings of end-user applications such as, but not limited to general purpose CPU utilization threshold values, bandwidth threshold values, etc. The example program 400 of FIG. 4 may operate during a setup stage of client application deployment and/or during runtime.

Figure 5:
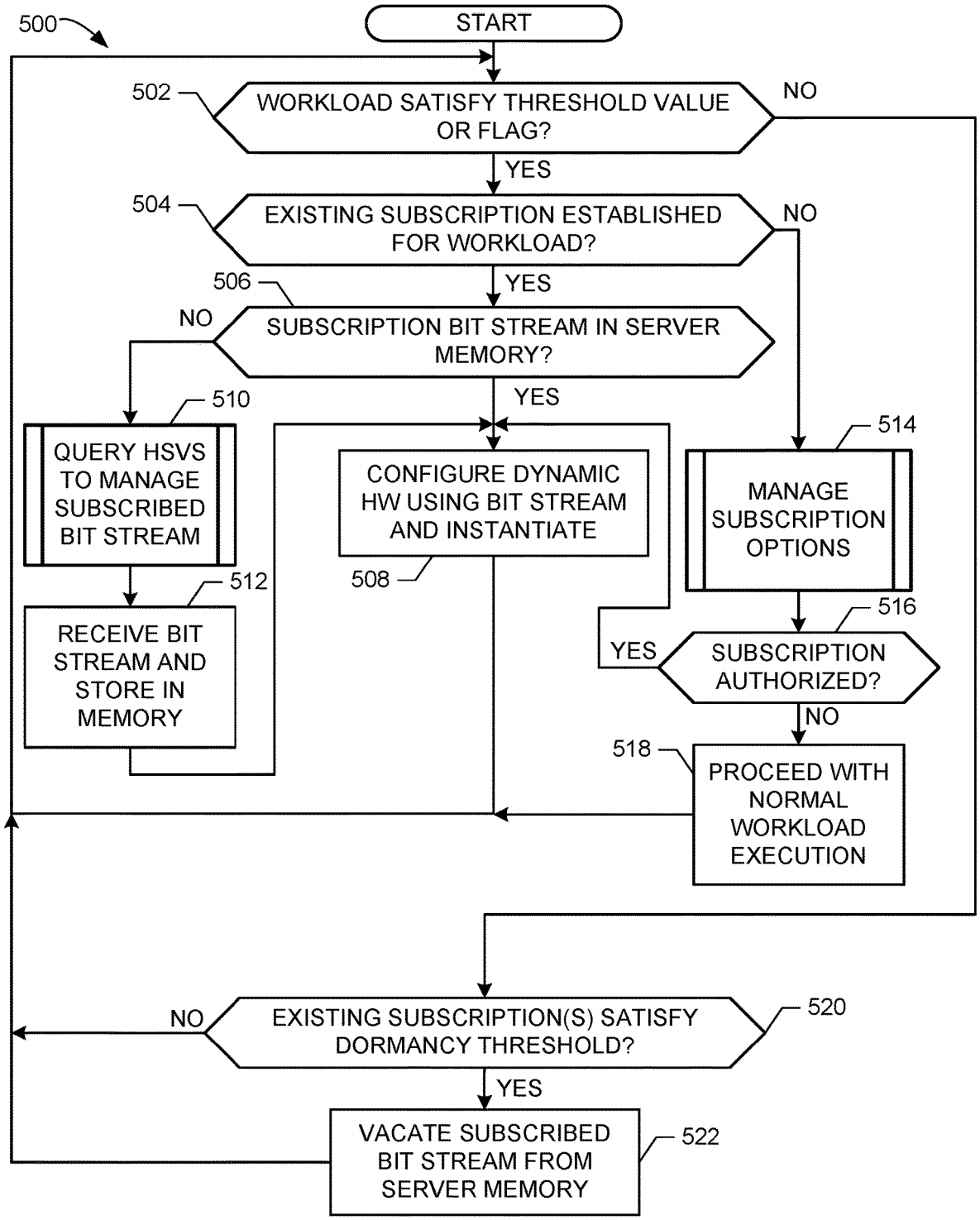

The program 500 of FIG. 5 illustrates runtime operation of the example cloud-computing environment 100. In the illustrated example of FIG. 5, the program 500 begins at block 502 where the example AS 202 determines whether a workload satisfies (e.g., exceeds) a threshold operating value and/or a particular application flag is true (e.g., a particular client application is executing or will execute). If so, then the example DDM 204 determines whether the client application is associated with an existing subscription that will permit FPGA operation (block 504). However, in circumstances where workload monitoring is not preferred (e.g., a default state of "inactive" is still true for such services), then the illustrated example program 500 of FIG. 5 may begin at block 504. The example DDM 204 determines if a corresponding physically reprogrammable bit stream is already stored in the example memory 212 of the CSP 102 (block 506). If so, then the example DDM 204 configures the dynamic/reprogrammable hardware (e.g., FPGAs) using the physically reprogrammable bit stream stored in the memory 212 and instantiates operation of one or more FPGAs allocated by the example CSP 102 (block 508). Additionally, the example DDM 204 instructs the general purpose processing hardware that was previously executing the workload to discontinue further workload processing. In other words, now that the reprogrammable hardware is processing the workload, then the DDM 204 relinquishes the general purpose CPU from further efforts to process that workload.

Figure 6:
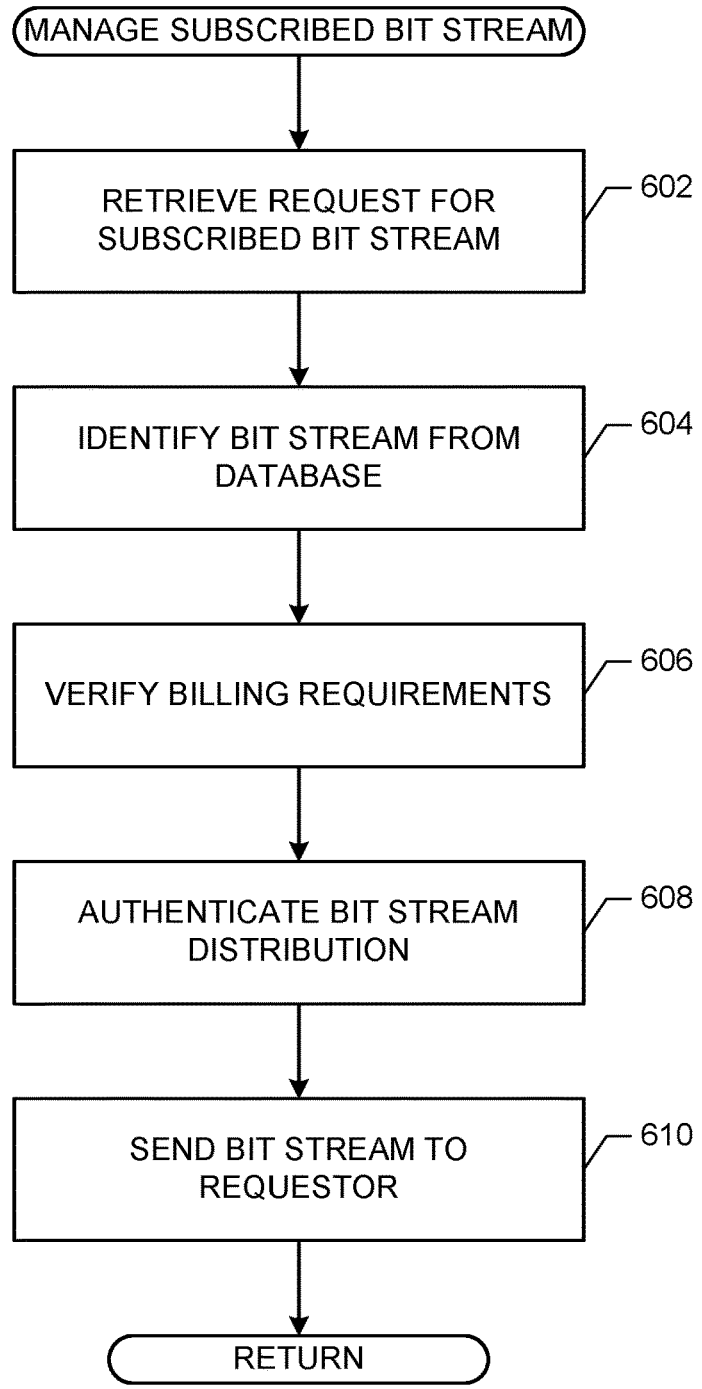

In the event that the physically reprogrammable bit stream associated with the end-user subscription is not stored in the memory 212 of the CSP 102 (block 506), then the example DDM 204 queries the example HSV system 108 to manage the subscribed physically reprogrammable bit stream (block 510), as described further in connection with FIG. 6. When the DDM 204 retrieves and/or otherwise receives the associated physically reprogrammable bit stream, it is stored in the memory 212 (block 512) and the FPGAs are configured according to the physically reprogrammable bit stream (block 508).

FIG. 6 illustrates additional detail associated with querying the HSV system 108 to manage subscribed physically reprogrammable bit streams of block 510. In the illustrated example of FIG. 6, the example SO 218 retrieves and/or otherwise receives a request for a subscribed physically reprogrammable bit stream (block 602). In some examples, the request includes identification information associated with the physically reprogrammable bit stream and/or account information associated with the client, which is used by the example SO 218 to identify the correct physically reprogrammable bit stream from the example subscription database 110 (block 604). The example billing manager 226 verifies that billing requirements have been satisfied (block 606), and the example authentication manager 224 authenticates the physically reprogrammable bit stream for distribution to the requesting party (block 608). The example SO 218 transmits and/or otherwise provides the requested physically reprogrammable bit stream to the requestor (block 610), and control returns to block 512 of FIG. 5.

Returning to block 504 of FIG. 5, in the event that there is no existing subscription associated with the invoked workload (e.g., a client network service 104, a client application service 106), then the example DDM 204 invokes the example HSV system 108 to manage subscription options (block 514), as described in further detail in connection with FIG. 7. In the event an appropriate physically reprogrammable bit stream is available and has been authorized (block 516), then the DDM 204 configures the FPGAs using the physically reprogrammable bit stream and instantiates operation of the FPGA resources (block 508). On the other hand, in the event there are no appropriate physically reprogrammable bit streams available for the workload (block 516), then the DDM 204 instructs the computing resources 208 to proceed with workload operation using the general purpose CPUs 210 (block 518).

Figure 7:
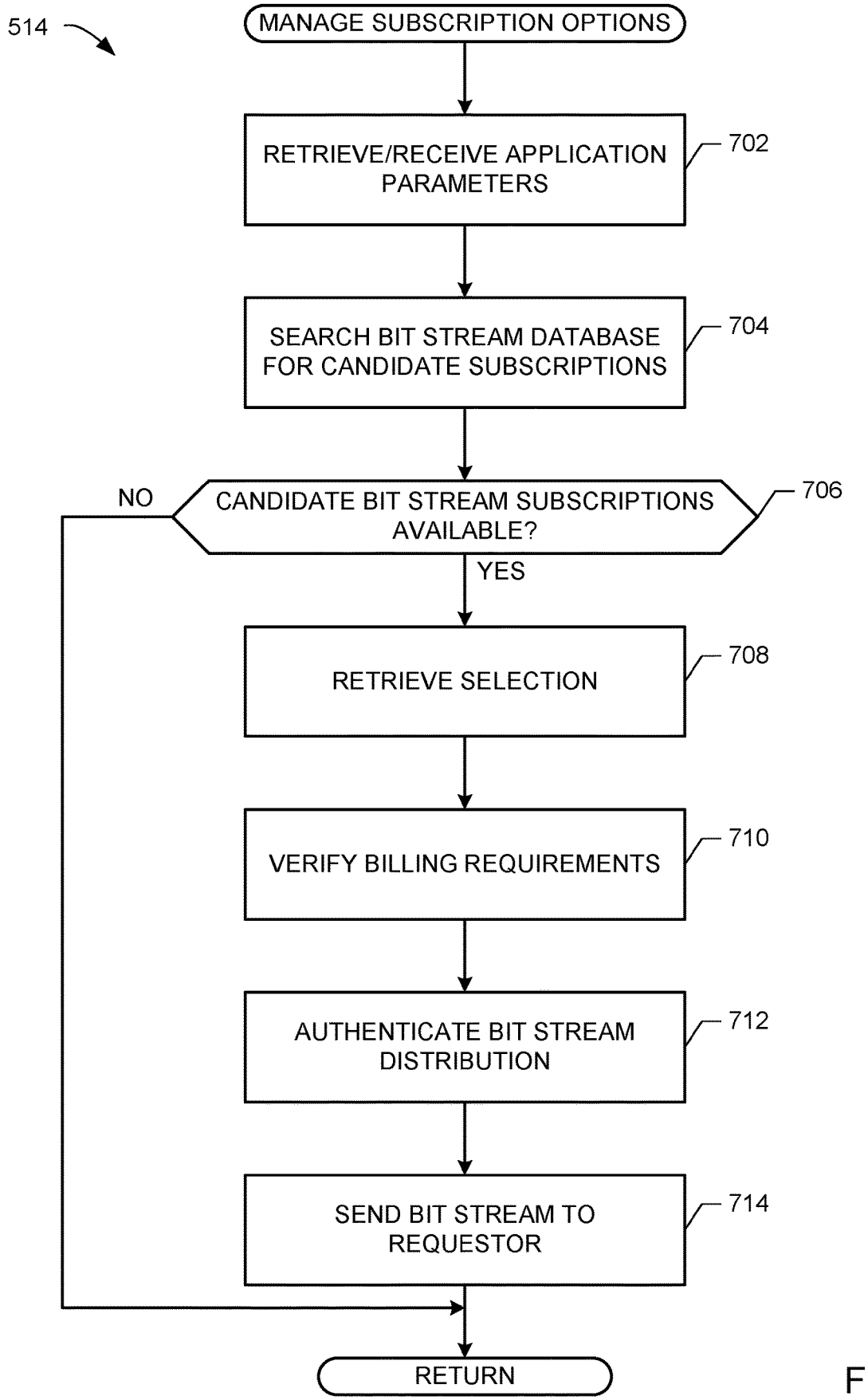

Turning to FIG. 7, the example SO 218 retrieves and/or otherwise receives workload parameters associated with a request to determine whether the subscription database 110 includes one or more physically reprogrammable bit streams that can assist workload performance (block 702). As described above in connection with FIG. 3, the request may include available parameters of the workload that are associated with a target FPGA platform that will be used with the CSP 102 and/or a type of application. The example application store interface 220 searches the physically reprogrammable bit stream database 110 for candidate subscription matches and returns a list of available options (block 704). In some examples, the application store interface 220 includes a user interface (e.g., a GUI) and/or web server to facilitate additional query options and/or selection of an appropriate option (block 706). In the event no options are available or selected (block 706), then the program 514 returns to block 516 of FIG. 5. On the other hand, if an option is selected, then the example SO 218 retrieves that selected physically reprogrammable bit stream from the subscription database 110 (block 708), and the example billing manager 226 verifies that billing requirements have been satisfied (block 710). The example authentication manager 224 verifies that the physically reprogrammable bit stream is authorized for distribution (block 712), and the example SO 218 transmits and/or otherwise provides the selected physically reprogrammable bit stream to the memory 212 via the network interface 214 (block 714). Control then returns to block 516 of FIG. 5.

During runtime, in the event no workloads have satisfied threshold values and/or identified active flags associated with workloads (block 502), the example AS 202 determines whether existing subscription physically reprogrammable bit streams satisfy dormancy threshold values (block 520). If not, control returns to block 502 to continue monitoring the computing resources 208 for instances of workload threshold satisfaction. However, if one or more workloads satisfies threshold values indicative of dormancy (block 520), then the example DDM 204 vacates the associated physically reprogrammable bit stream from memory 212 to conserve memory resources for other, more current, physically reprogrammable bit streams (block 522).

Figure 8:
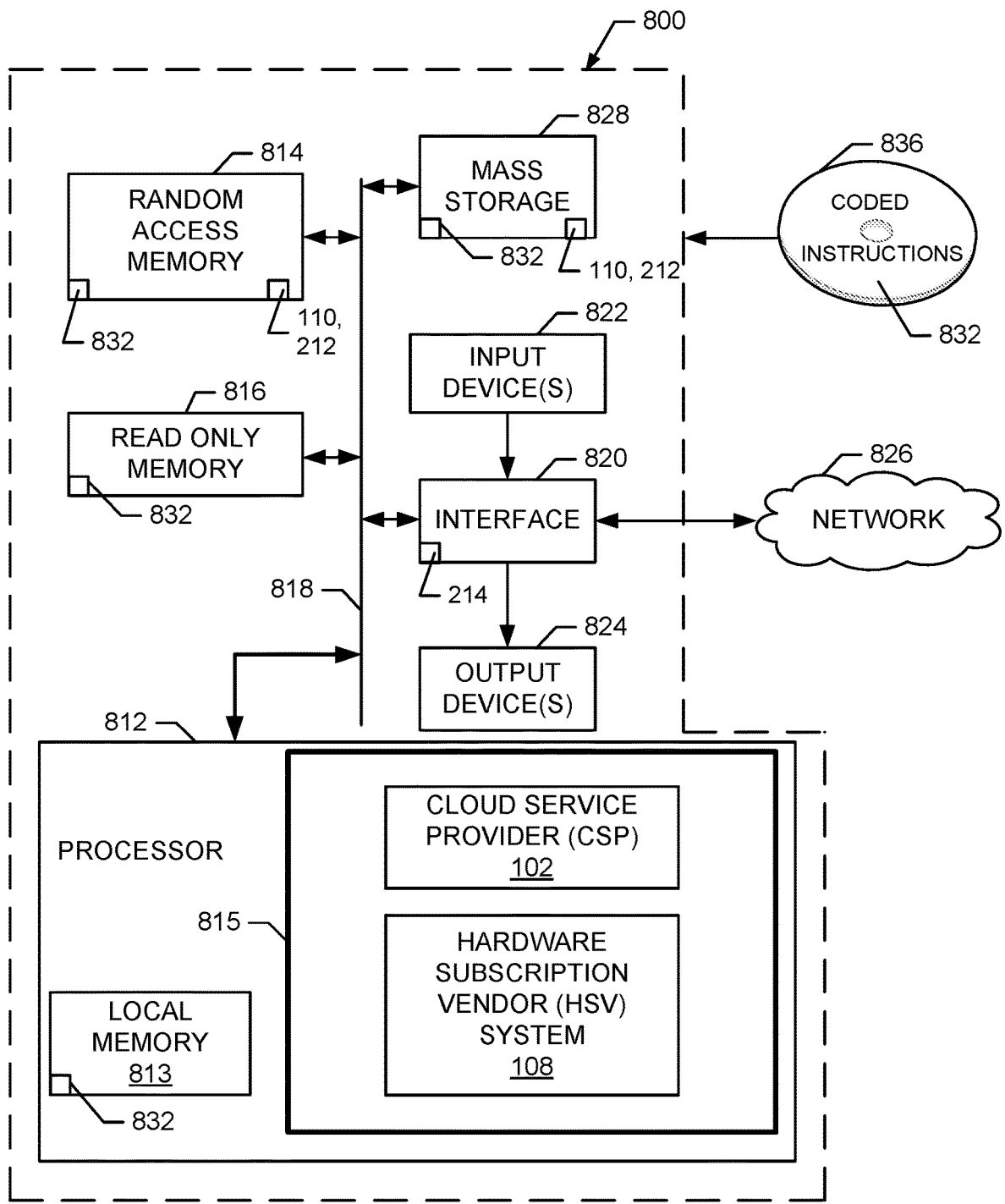
FIG. 8 is a block diagram of an example processor platform structured to execute the example machine readable instructions of FIGS. 4-7 to implement the example cloud computing environment of FIGS. 1-3.

FIG. 8 is a block diagram of an example processor platform 800 capable of executing the instructions of FIGS. 4-7 to implement the apparatus of FIGS. 1-3. The processor platform 800 can be, for example, a server, a personal computer, or any other type of computing device.

The processor platform 800 of the illustrated example includes a processor 812. The processor 812 of the illustrated example is hardware. For example, the processor 812 can be implemented by one or more integrated circuits, logic circuits, microprocessors or controllers from any desired family or manufacturer. In the illustrated example of FIG. 8, the processor 812 includes one or more example processing cores 815 configured via example instructions 832, which include the example instructions of FIGS. 4-7 to implement the example CSP 102 and/or HSV 108 of FIGS. 1-3.

The processor 812 of the illustrated example includes a local memory 813 (e.g., a cache). The processor 812 of the illustrated example is in communication with a main memory including a random access memory (RAM) 814 and a read only memory (ROM) (e.g., non-volatile memory) 816 via a bus 818. The RAM 814 may be implemented by Synchronous Dynamic Random Access Memory (SDRAM), Dynamic Random Access Memory (DRAM), RAMBUS Dynamic Random Access Memory (RDRAM) and/or any other type of random access memory device. The ROM 816 may be implemented by flash memory and/or any other desired type of memory device. Access to the main memory 814, 816 is controlled by a memory controller.

The processor platform 800 of the illustrated example also includes an interface circuit 820. The interface circuit 820 may be implemented by any type of interface standard, such as an Ethernet interface, a universal serial bus (USB), and/or a PCI express interface.

In the illustrated example, one or more input devices 822 are connected to the interface circuit 820. The input device(s) 822 permit(s) a user to enter data and commands into the processor 812. The input device(s) can be implemented by, for example, an audio sensor, a microphone, a camera (still or video), a keyboard, a button, a mouse, a touchscreen, a track-pad, a trackball, isopoint and/or a voice recognition system.

One or more output devices 824 are also connected to the interface circuit 820 of the illustrated example. The output devices 824 can be implemented, for example, by display devices (e.g., a light emitting diode (LED), an organic light emitting diode (OLED), a liquid crystal display, a cathode ray tube display (CRT), a touchscreen, a tactile output device, a printer and/or speakers). The interface circuit 820 of the illustrated example, thus, typically includes a graphics driver card, a graphics driver chip or a graphics driver processor.

The interface circuit 820 of the illustrated example also includes a communication device such as a transmitter, a receiver, a transceiver, a modem and/or network interface card to facilitate exchange of data with external machines (e.g., computing devices of any kind) via a network 826 (e.g., an Ethernet connection, a digital subscriber line (DSL) to facilitate exchange of data within a similar machine platform (e.g., a communication bus), a telephone line, coaxial cable, a cellular telephone system, etc.).

The processor platform 800 of the illustrated example also includes one or more mass storage devices 828 for storing software and/or data. Examples of such mass storage devices 828 include floppy disk drives, hard drive disks, compact disk drives, Blu-ray disk drives, RAID systems, solid-state-drives (SSDs) and digital versatile disk (DVD) drives. In some examples, the mass storage device 830 may implement the example subscription database 110.

The coded instructions 832 of FIGS. 4-7 may be stored in the mass storage device 828, in the volatile memory 814, in the non-volatile memory 816, and/or on a removable tangible computer readable storage medium such as a CD or DVD 836.

From the foregoing, it will be appreciated that methods, apparatus and articles of manufacture have been disclosed which reduce consumed resources of cloud service providers by allowing reprogrammable hardware devices an opportunity to perform one or more tasks in a more efficient manner than could otherwise be performed by general purpose CPUs. In particular, because reprogrammable hardware devices, such as FPGAs, can be programmed and/or otherwise configured for specific tasks, a reduction in processing time/process cycles, improvement related to a general purpose processor executing software is realized by the reprogrammable hardware, whether such hardware resides on cloud-based services or individual devices. Additionally, end-users that choose to utilize one or more reprogrammable hardware resources offered by the cloud service provider can potentially save money that would otherwise be spent using cycles performed by the general purpose CPUs. Furthermore, the cloud service provider permits an opportunity to (a) improve client workload execution and (b) conserve limited general purpose CPU resources that are shared among any number of other end-users of the cloud service provider.

Additional benefits of examples disclosed herein include enablement of hardware subscription business models for independent network or application service providers (e.g., AT&T, F5 Networks, Cisco, etc.) to execute their applications in a hardware-optimized manner (e.g., accelerated). Client applications may operate with hardware subscriptions (one or more physically reprogrammable bit streams) that can be executed on CSP infrastructures, which facilitates a business model for physically reprogrammable bit stream developers, increases feature capabilities to be offered by CSPs to their end-users, conserves processing resources, improves client application performance, and conserves limited platform resources of the CSPs. Additionally, telecom cloud providers (TCPs) such as AT&T, China Telecom, T-Mobile and Verizon may use standard servers with FPGAs rather than fix-function networking equipment and/or appliances, thereby reducing a corresponding total cost outlay for their services. In other words, such TCPs no longer need to rely on unique telecom appliances in their network infrastructure and may instead employ cloud-based reprogrammable hardware devices, such as FPGAs.

Examples disclosed herein enable TCPs to market their segments/customers by offering SLAs that improve the reliability of their computing, storage and/or networking infrastructure services. Typically, to maintain specific SLAs the TCPs need to enforce a relatively high degree of control over what computing resources and/or software are deployed so that they can satisfy uptime commitments (e.g., 24 hours per day, 7 days a week). Further, the TCPs may scale-up or scale-down and/or adapt to new/alternate standards as a number of subscribers grows/shrinks. Such scaling may be realized with examples disclosed herein to maintain SLAs that are more robust than traditional SLAs. This also encourages equipment standardization of different parts of the TCP infrastructure. Further, in the event TCP functionality is to evolve, dynamically configured hardware devices, such as example FPGAs, can be configured to meet such new and evolved functionality without truck-rolls to replace specialized hardware.

Figure 9:
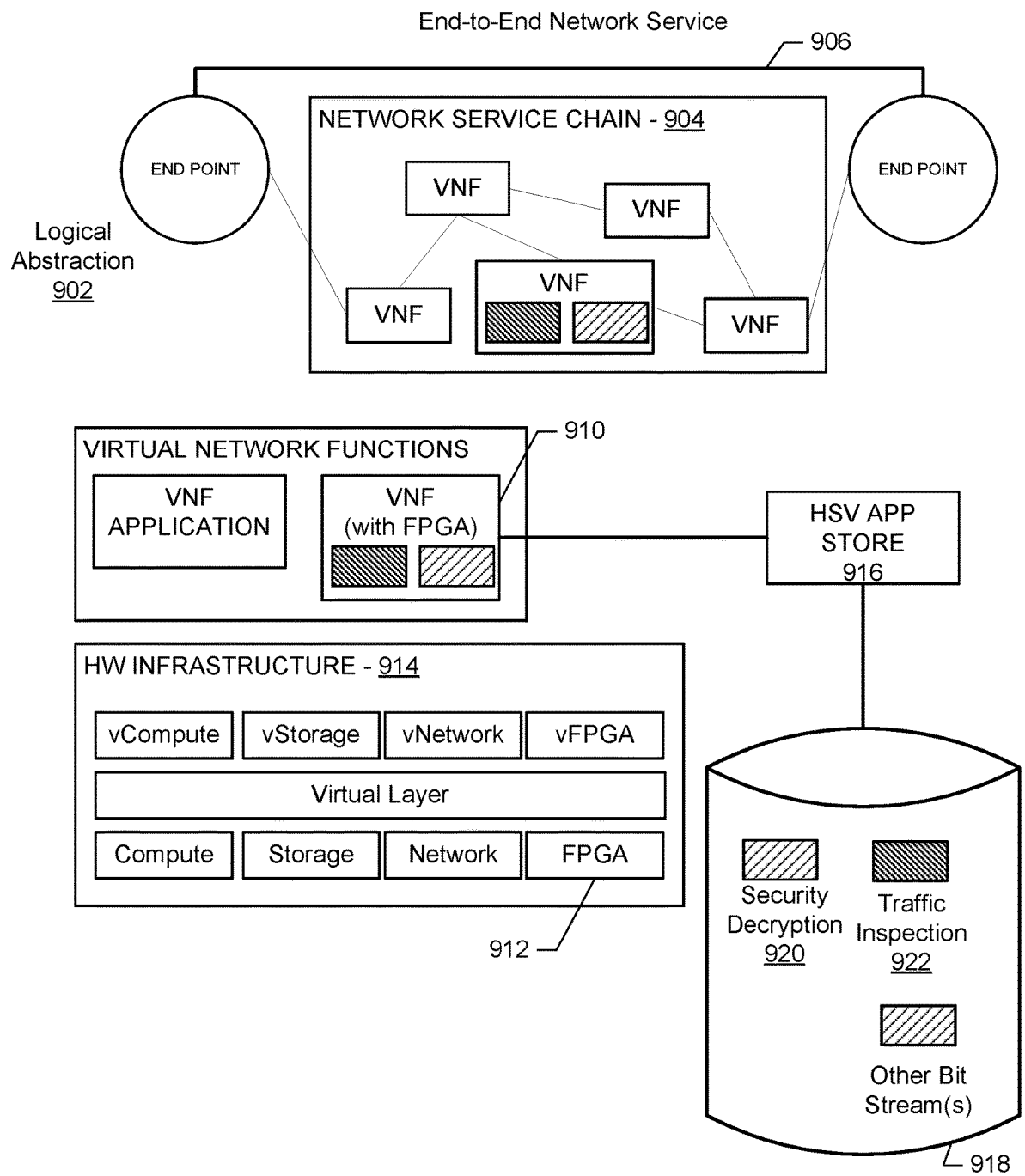
FIG. 9 is a schematic illustration of an example use case of the example cloud computing environment of FIGS. 1-3.

FIG. 9 includes additional examples with which the example cloud-computing environment may support VNF End2End service chaining operations for NFV/SDNs. In particular, FIG. 9 includes a logical abstraction 902 of an example network service chain 904 connected via an end-to-end network service 906. The example network service chain 904 includes any number of VNFs, in which a dynamic VNF 908 may require different operating parameters depending on, for example, a time of day. The example VNFs of the network service chain 904 are implemented as virtual network functions 910 enabled by example FPGA devices 912 of a hardware infrastructure 914, which could be provided by a CSP. An example HSV system 916 facilitates access to any number of physically reprogrammable bit streams stored on a subscription database 918, such as a first physically reprogrammable bit stream for security decryption operations 920, and a second physically reprogrammable bit stream for traffic inspection operations 922, then another bit stream used for re-encryption. All VNFs may be running on different operating systems and chained together to make up the end-to-end network service chain 904.

In the illustrated example of FIG. 9, assume that the virtual network function 910 has subscribed to the physically reprogrammable first bit stream 920 and the second physically reprogrammable bit stream 922. As such, either physically reprogrammable bit stream may be invoked as needed in the example network service chain 904 depending on instantaneous needs. In the event a third physically reprogrammable bit stream 924 is needed in the future, it can be obtained from the example subscription database 918 via the example HSV system 916.

In some examples, country-specific encryption and/or decryption may be needed, in which such activities are regulated and may change on a relatively frequent basis. In view of such regulatory flux and uncertainty, manufacturers of special-purpose hardware experience short life cycles of their special-purpose hardware products and/or solutions. Accordingly, developers of solutions for such special-purpose functionality may be reluctant to engage in development efforts for fear that a relatively long-term life cycle of any developed special-purpose product will not be realized. On the other hand, examples disclosed herein facilitate an ability to develop such special-purpose functionality that is targeted to reprogrammable hardware (e.g., FPGAs). As such, manufacturing costs for special-purpose hardware are reduced, repeated hardware export/import compliance efforts are reduced, and in the event regulations change, the same reprogrammable hardware devices can be used for implementing the new/alternate regulations (e.g., alternate encryption/decryption requirements imposed by particular country jurisdictions). In other words, rather than developing a new special-purpose hardware product that must satisfy customs requirements when shipped to the jurisdiction of interest, the same reprogrammable hardware devices may continue to be used to implement the alternate/updated functionality requirements via transmission of an appropriate bit stream.

Example methods, apparatus, systems and articles of manufacture to improve computing resource utilization are disclosed herein. Further examples and combinations thereof include the following.

Example 1 is an apparatus including an application specific sensor (AS) to monitor a workload of at least one general purpose central processing unit (CPU) of a platform; and a dynamic deployment module (DDM) to: in response to a workload performance threshold being satisfied, identify a physically reprogrammable bit stream capable of configuring a reprogrammable hardware device to execute at least one function of the workload; and configure the reprogrammable hardware device via the physically reprogrammable bit stream to execute the at least one function of the workload.

Example 2 includes the apparatus as defined in example 1, wherein the DDM configures the reprogrammable hardware device to optimize a performance metric.

Example 3 includes the apparatus as defined in example 2, wherein the optimized performance metric is a latency of the workload, the latency reduced when the at least one function is executed by the reprogrammable hardware device and the at least one function is not executed by the general purpose CPU.

Example 4 includes the apparatus as defined in example 1, wherein the DDM is to query a subscription orchestrator when the physically reprogrammable bit stream capable of configuring the reprogrammable hardware device to execute the at least one function of the workload is not stored within a memory of the platform.

Example 5 includes the apparatus as defined in example 4, wherein the DDM is to retrieve the physically reprogrammable bit stream from the subscription orchestrator in response to verifying that an identifier of the workload is authorized to receive the bit stream.

Example 6 includes the apparatus as defined in example 1, wherein the AS is to determine if the bit stream has been dormant for a threshold period of time.

Example 7 includes the apparatus as defined in example 6, wherein the DDM is to vacate the bit stream from a memory in response to receiving an indication that the bit stream has been dormant for at least the threshold period of time.

Example 8 includes the apparatus as defined in example 1, wherein the DDM is to instruct the general purpose CPU to discontinue executing the workload in response to the reprogrammable hardware device executing the workload.

Example 9 includes the apparatus as defined in example 1, wherein the platform is located on at least one of a cloud-based computing resource or a stand-alone computing device.

Example 10 includes the apparatus as defined in example 1, wherein the DDM is to obtain the physically reprogrammable bit stream for stand-alone computing devices associated with an Enterprise information technology network.

Example 11 includes the apparatus as defined in example 10, wherein the DDM is to configure the reprogrammable hardware device with an alternate physically reprogrammable bit stream to facilitate an alternate workload of the platform.

Example 12 is a method, comprising monitoring a workload of at least one general purpose central processing unit (CPU) of a platform, in response to a workload performance threshold being satisfied, identifying a physically reprogrammable bit stream capable of configuring a reprogrammable hardware device to execute at least one function of the workload, and configuring the reprogrammable hardware device via the physically reprogrammable bit stream to execute the at least one function of the workload.

Example 13 includes the method as defined in example 12, further including configuring the reprogrammable hardware device to optimize a performance metric.

Example 14 includes the method as defined in example 13, wherein the optimized performance metric is a latency of the workload, the latency reduced when the at least one function is executed by the reprogrammable hardware device and the at least one function is not executed by the general purpose CPU.

Example 15 includes the method as defined in claim 12, further including querying a subscription orchestrator when the physically reprogrammable bit stream capable of configuring the reprogrammable hardware device to execute the at least one function of the workload is not stored within a memory of the platform.

Example 16 includes the method as defined in example 15, further including retrieving the physically reprogrammable bit stream from the subscription orchestrator in response to verifying that an identifier of the workload is authorized to receive the bit stream.

Example 17 includes the method as defined in example 12, further including determining if the bit stream has been dormant for a threshold period of time.

Example 18 includes the method as defined in example 17, further including vacating the bit stream from a memory in response to receiving an indication that the bit stream has been dormant for at least the threshold period of time.

Example 19 includes the method as defined in example 12, further including instructing the general purpose CPU to discontinue executing the workload in response to the reprogrammable hardware device executing the workload.

Example 20 includes the method as defined in example 12, wherein the platform is located on at least one of a cloud-based computing resource or a stand-alone computing device.

Example 21 includes the method as defined in example 12, further including obtaining the physically reprogrammable bit stream for stand-alone computing devices associated with an Enterprise information technology network.

Example 22 includes the method as defined in example 21, further including configuring the reprogrammable hardware device with an alternate physically reprogrammable bit stream to facilitate an alternate workload of the platform.

Example 23 is a tangible computer-readable storage disk or storage device comprising instructions which, when executed, cause a processor to at least: monitor a workload of at least one general purpose central processing unit (CPU) of a platform, in response to a workload performance threshold being satisfied, identify a physically reprogrammable bit stream capable of configuring a reprogrammable hardware device to execute at least one function of the workload, and configure the reprogrammable hardware device via the physically reprogrammable bit stream to execute the at least one function of the workload.

Example 24 includes the tangible computer-readable storage disk or storage device as defined in example 23, wherein the instructions, when executed, further cause the processor to configure the reprogrammable hardware device to optimize a performance metric.

Example 25 includes the tangible computer-readable storage disk or storage device as defined in example 24, wherein the instructions, when executed, further cause the processor to reduce a latency of the workload when the at least one function is executed by the reprogrammable hardware device and the at least one function is not executed by the general purpose CPU.

Example 26 includes the tangible computer-readable storage disk or storage device as defined in example 23, wherein the instructions, when executed, further cause the processor to query a subscription orchestrator when the physically reprogrammable bit stream capable of configuring the reprogrammable hardware device to execute the at least one function of the workload is not stored within a memory of the platform.

Example 27 includes the tangible computer-readable storage disk or storage device as defined in example 26, wherein the instructions, when executed, further cause the processor to retrieve the physically reprogrammable bit stream from the subscription orchestrator in response to verifying that an identifier of the workload is authorized to receive the bit stream.

Example 28 includes the tangible computer-readable storage disk or storage device as defined in example 23, wherein the instructions, when executed, further cause the processor to determine if the bit stream has been dormant for a threshold period of time.

Example 29 includes the tangible computer-readable storage disk or storage device as defined in example 28, wherein the instructions, when executed, further cause the processor to vacate the bit stream from a memory in response to receiving an indication that the bit stream has been dormant for at least the threshold period of time.

Example 30 includes the tangible computer-readable storage disk or storage device as defined in example 23, wherein the instructions, when executed, further cause the processor to instruct the general purpose CPU to discontinue executing the workload in response to the reprogrammable hardware device executing the workload.

Example 31 includes the tangible computer-readable storage disk or storage device as defined in example 23, wherein the instructions, when executed, further cause the processor to obtain the physically reprogrammable bit stream for stand-alone computing devices associated with an Enterprise information technology network.

Example 32 includes the tangible computer-readable storage disk or storage device as defined in example 31, wherein the instructions, when executed, further cause the processor to configure the reprogrammable hardware device with an alternate physically reprogrammable bit stream to facilitate an alternate workload of the platform.

Example 33 is a system including means for monitoring a workload of at least one general purpose central processing unit (CPU) of a platform, in response to a workload performance threshold being satisfied, means for identifying a physically reprogrammable bit stream capable of configuring a reprogrammable hardware device to execute at least one function of the workload, and means for configuring the reprogrammable hardware device via the physically reprogrammable bit stream to execute the at least one function of the workload.

Example 34 includes the system as defined in example 33, further including means for configuring the reprogrammable hardware device to optimize a performance metric.

Example 35 includes the system as defined in example 34, wherein the optimized performance metric is a latency of the workload, the latency reduced when the at least one function is executed by the reprogrammable hardware device and the at least one function is not executed by the general purpose CPU.

Example 36 includes the system as defined in example 33, further including means for querying a subscription orchestrator when the physically reprogrammable bit stream capable of configuring the reprogrammable hardware device to execute the at least one function of the workload is not stored within a memory of the platform.

Example 37 includes the system as defined in example 36, further including means for retrieving the physically reprogrammable bit stream from the subscription orchestrator in response to verifying that an identifier of the workload is authorized to receive the bit stream.

Example 38 includes the system as defined in example 33, further including means for determining if the bit stream has been dormant for a threshold period of time.

Example 39 includes the system as defined in example 38, further including means for vacating the bit stream from a memory in response to receiving an indication that the bit stream has been dormant for at least the threshold period of time.

Example 40 includes the system as defined in example 33, further including means for instructing the general purpose CPU to discontinue executing the workload in response to the reprogrammable hardware device executing the workload.

Example 41 includes the system as defined in example 33, wherein the platform is located on at least one of a cloud-based computing resource or a stand-alone computing device.

Example 42 includes the system as defined in example 33, further including means for obtaining the physically reprogrammable bit stream for stand-alone computing devices associated with an Enterprise information technology network.

Example 43 includes the system as defined in example 42, further including means for configuring the reprogrammable hardware device with an alternate physically reprogrammable bit stream to facilitate an alternate workload of the platform.

Example 44 includes any of the examples above, further including optimizing at least one of cloud computing resources or localized machine resources.

Example 45 includes example 44, further including an information technology (IT) group to manage personnel devices having FPGA hardware capabilities.

Example 46 includes example 44, wherein optimization is realized by way of distributed physically reprogrammable bit streams to accomplish one or more tasks.

Example 47 includes example 46, wherein the one or more tasks include at least one of security offloading acceleration or searching tasks.

Example 48 includes example 44, further including an original equipment manufacturer (OEM) to change a persona of a device based on at least one physically reprogrammable bit stream.

Example 49 includes example 48, further including one or more keys to authorize bit stream access by the OEM.

Example 50 includes example 44, further including a toggle setting to at least one of enable or disable application specific sensor monitoring of platform applications.

Although certain example methods, apparatus and articles of manufacture have been disclosed herein, the scope of coverage of this patent is not limited thereto. On the contrary, this patent covers all methods, apparatus and articles of manufacture fairly falling within the scope of the claims of this patent.

What is claimed is:

1. An apparatus, comprising:
an application specific sensor (AS) to monitor a workload of at least one general purpose central processing unit (CPU) of a platform; and
a dynamic deployment module (DDM) to:
in response to a workload performance threshold being satisfied, identify parameters associated with physically reprogrammable bit streams;
match one of the physically reprogrammable bit streams to a type of the workload based on one of the identified parameters, the matching one of the physically reprogrammable bit streams to configure a reprogrammable hardware device to execute at least one function of the workload;
verify that an identifier of the workload is authorized to receive the matching one of the physically reprogrammable bit streams from a third party developer, wherein the identifier of the workload includes authorization information; and
in response to verifying that the identifier of the workload is authorized to receive the matching one of the physically reprogrammable bit streams from the third party developer, configure the reprogrammable hardware device via the matching one of the physically reprogrammable bit streams to execute the at least one function of the workload, at least one of the AS or the DDM including a logic circuit.

2. The apparatus as defined in claim 1, wherein the DDM is to configure the reprogrammable hardware device to optimize a performance metric of the workload.

3. The apparatus as defined in claim 2, wherein the optimized performance metric is a latency of the workload, the latency reduced when the at least one function is executed by the reprogrammable hardware device and the at least one function is not executed by the at least one general purpose CPU.

4. The apparatus as defined in claim 1, wherein the DDM is to query a subscription orchestrator when the matching one of the physically reprogrammable bit streams capable of configuring the reprogrammable hardware device to execute the at least one function of the workload is not stored within a memory of the platform.

5. The apparatus as defined in claim 4, wherein the DDM is to retrieve the matching one of the physically reprogrammable bit streams from the subscription orchestrator in response to verifying that the identifier of the workload is authorized to receive the matching one of the physically reprogrammable bit streams.

6. The apparatus as defined in claim 1, wherein the DDM is to instruct the at least one general purpose CPU to discontinue executing the workload in response to the reprogrammable hardware device executing the workload.

7. The apparatus as defined in claim 1, wherein the platform is located on at least one of a cloud-based computing resource or a stand-alone computing device.

8. A method, comprising:
monitoring a workload of at least one general purpose central processing unit (CPU) of a platform;
in response to a workload performance threshold being satisfied, identifying parameters associated with physically reprogrammable bit streams;
matching one of the physically reprogrammable bit streams to a type of the workload based on one of the identified parameters, the matching one of the physically reprogrammable bit streams to configure a reprogrammable hardware device to execute at least one function of the workload;
verifying that an identifier of the workload is authorized to receive the matching one of the physically reprogrammable bit streams from a third party developer, wherein the identifier of the workload includes authorization information; and
in response to verifying that the identifier of the workload is authorized to receive the matching one of the physically reprogrammable bit streams from the third party developer, configuring the reprogrammable hardware device via the matching one of the physically reprogrammable bit streams to execute the at least one function of the workload.

9. The method as defined in claim 8, further including configuring the reprogrammable hardware device to optimize a performance metric of the workload.

10. The method as defined in claim 9, wherein the optimized performance metric is a latency of the workload, the latency reduced when the at least one function is executed by the reprogrammable hardware device and the at least one function is not executed by the general purpose CPU.

11. The method as defined in claim 8, further including querying a subscription orchestrator when the matching one of the physically reprogrammable bit streams capable of configuring the reprogrammable hardware device to execute the at least one function of the workload is not stored within a memory of the platform.

12. The method as defined in claim 11, further including retrieving the matching one of the physically reprogrammable bit streams from the subscription orchestrator in response to verifying that the identifier of the workload is authorized to receive the matching one of the physically reprogrammable bit streams.

13. The method as defined in claim 8, further including instructing the general purpose CPU to discontinue executing the workload in response to the reprogrammable hardware device executing the workload.

14. The method as defined in claim 8, further including obtaining the matching one of the physically reprogrammable bit streams for stand-alone computing devices associated with an Enterprise information technology network.

15. The method as defined in claim 14, further including configuring the reprogrammable hardware device with an alternate physically reprogrammable bit stream to facilitate an alternate workload of the platform.

16. A tangible computer-readable storage disk or storage device comprising instructions which, when executed, cause a processor to at least:
monitor a workload of at least one general purpose central processing unit (CPU) of a platform;
in response to a workload performance threshold being satisfied, identify parameters associated with physically reprogrammable bit streams
match one of the physically reprogrammable bit streams to a type of the workload based on one of the identified parameters, the matching one of the physically reprogrammable bit streams to configure a reprogrammable hardware device to execute at least one function of the workload;
verify that an identifier of the workload is authorized to receive the matching one of the physically reprogrammable bit streams from a third party developer, wherein the identifier of the workload includes authorization information; and
in response to verifying that the identifier of the workload is authorized to receive the matching one of the physically reprogrammable bit streams from the third party developer, configure the reprogrammable hardware device via the matching one of the physically reprogrammable bit streams to execute the at least one function of the workload.

17. The tangible computer-readable storage disk or storage device as defined in claim 16, wherein the instructions, when executed, further cause the processor to configure the reprogrammable hardware device to optimize a performance metric of the workload.

18. The tangible computer-readable storage disk or storage device as defined in claim 17, wherein the instructions, when executed, further cause the processor to reduce a latency of the workload when the at least one function is executed by the reprogrammable hardware device and the at least one function is not executed by the general purpose CPU.

19. The tangible computer-readable storage disk or storage device as defined in claim 16, wherein the instructions, when executed, further cause the processor to query a subscription orchestrator when the matching one of the physically reprogrammable bit streams capable of configuring the reprogrammable hardware device to execute the at least one function of the workload is not stored within a memory of the platform.

20. The tangible computer-readable storage disk or storage device as defined in claim 19, wherein the instructions, when executed, further cause the processor to retrieve the matching one of the physically reprogrammable bit streams from the subscription orchestrator in response to verifying that the identifier of the workload is authorized to receive the matching one of the physically reprogrammable bit streams.

21. The apparatus as defined in claim 1, wherein the DDM is to verify that the identifier of the workload is authorized to receive the matching one of the physically reprogrammable bit streams from a third party developer based on whether the identifier of the workload is associated with the matching one of the physically reprogrammable bit streams.

22. The apparatus as defined in claim 1, wherein the identifier of the workload is at least one of billing account information, a unique serial number, a unique hash value, or a unique license key associated with an authorized client.

23. The method as defined in claim 8, wherein the verifying that the identifier of the workload is authorized to receive the matching one of the physically reprogrammable bit streams from a third party developer is based on whether the identifier of the workload is associated with the matching one of the physically reprogrammable bit streams.

24. The tangible computer-readable storage disk or storage device as defined in claim 19, wherein the instructions, when executed, cause the processor to verify that the identifier of the workload is authorized to receive the matching one of the physically reprogrammable bit streams from a third party developer based on whether the identifier of the workload is associated with the matching one of the physically reprogrammable bit streams.

* * * * *